United States Patent
Zheng

(10) Patent No.: US 11,158,724 B1
(45) Date of Patent: Oct. 26, 2021

(54) METHOD OF MANUFACTURING DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Jiexin Zheng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 198 days.

(21) Appl. No.: 16/617,797

(22) PCT Filed: Aug. 6, 2019

(86) PCT No.: PCT/CN2019/099356
§ 371 (c)(1),
(2) Date: Nov. 27, 2019

(87) PCT Pub. No.: WO2020/248349
PCT Pub. Date: Dec. 17, 2020

(30) Foreign Application Priority Data

Jun. 12, 2019 (CN) .......................... 201910505464.0

(51) Int. Cl.
*H01L 21/00* (2006.01)
*H01L 29/00* (2006.01)
(Continued)

(52) U.S. Cl.
CPC .... *H01L 29/66742* (2013.01); *H01L 29/7869* (2013.01); *H01L 21/12* (2013.01); *H01L 21/4763* (2013.01)

(58) Field of Classification Search
CPC ............. H01L 21/467; H01L 21/33139; H01L 21/4763; H01L 21/77; H01L 21/12;
(Continued)

(56) References Cited

U.S. PATENT DOCUMENTS 8,569,121 B2 * 10/2013 Haensch ............... H01L 29/122
438/160
10,347,769 B2 * 7/2019 Sasagawa ......... H01L 29/78618
(Continued)

FOREIGN PATENT DOCUMENTS

| CN | 107146773 A | 9/2017 |
| CN | 108122759 A | 6/2018 |

(Continued)

*Primary Examiner* — Nikolay K Yushin
(74) *Attorney, Agent, or Firm* — Osha Bergman Watanabe & Burton LLP

(57) ABSTRACT

The disclosure provides a method of manufacturing a display panel, including: sequentially forming a buffer layer, an oxide semiconductor layer, and a photoresist layer on a substrate; removing the photoresist layer corresponding to a gate defining region to obtain a photoresist section; forming a first metal layer on the photoresist layer and the oxide semiconductor layer which is not covered by the photoresist layer; and peeling off the photoresist section to remove the first metal layer on the photoresist section, wherein the first metal layer which corresponds to the gate defining region remains to obtain a gate.

18 Claims, 3 Drawing Sheets

(51) Int. Cl.
*H01L 29/66* (2006.01)
*H01L 29/786* (2006.01)
*H01L 21/4763* (2006.01)
*H01L 21/12* (2006.01)

(58) Field of Classification Search
CPC ........... H01L 29/66742; H01L 29/7869; H01L 29/66969; H01L 29/49; H01L 29/78696; H01L 29/42384
See application file for complete search history.

(56) References Cited

U.S. PATENT DOCUMENTS

| | | | |
|---|---|---|---|
| 10,483,129 B2* | 11/2019 | Feng | ...................... H01L 21/321 |
| 2014/0284595 A1* | 9/2014 | Sasagawa | ......... H01L 29/78618 257/43 |
| 2018/0226269 A1* | 8/2018 | Feng | ...................... G03F 7/0035 |
| 2018/0331200 A1 | 11/2018 | Xia | |
| 2019/0081159 A1 | 3/2019 | Song et al. | |

FOREIGN PATENT DOCUMENTS

| | | |
|---|---|---|
| CN | 108538860 A | 9/2018 |
| JP | S61105870 A | 5/1986 |
| JP | S61121366 A | 6/1986 |

* cited by examiner

METHOD OF MANUFACTURING DISPLAY PANEL

FIELD

The present disclosure relates to the display field and, more particularly, relates to a method of manufacturing a display panel.

BACKGROUND

Top gate thin film transistors (TFTs) are widely used in display panels due to their self-alignment advantage.

As shown in FIG. 1, a conventional process of manufacturing a TFT is sequentially forming a buffer layer 12, an oxide semiconductor layer 13, an insulating layer 14', and a metal layer 15' on a substrate 11; blocking a gate region by a photoresist 21; and then etching the insulating layer 14' and the metal layer 15' which are not blocked by the photoresist 21 by both a dry etching process and a wet etching process to form a gate insulating layer and a gate pattern. However, the top surface of the oxide semiconductor layer 13 is easily damaged because the above etching processes occur on the top surface of the oxide semiconductor layer 13, which reduces conductivity of a device.

Consequently, it is necessary to provide a method of manufacturing a display panel to solve a problem of conventional technology.

SUMMARY

An object of the present disclosure is to provide a method of manufacturing a display panel that prevents damage to the top surface of an oxide semiconductor layer and improves conductivity of a device.

To solve the above technical problem, the present disclosure provides a method of manufacturing a display panel, including: sequentially forming a buffer layer and an oxide semiconductor layer on a substrate; forming a photoresist layer on the oxide semiconductor layer, patterning the photoresist layer, and removing the photoresist layer corresponding to a gate defining region to obtain a photoresist section, wherein material of the photoresist layer is a negative photoresist material; sequentially forming a first insulating layer and a first metal layer on the photoresist layer and the oxide semiconductor layer which is not covered by the photoresist layer; and peeling off the photoresist section to remove the first insulating layer and the first metal layer on the photoresist section, wherein the first insulating layer and the first metal layer which correspond to the gate defining region are remained to respectively obtain a gate insulating layer and a gate.

The present disclosure provides a method of manufacturing a display panel, including: sequentially forming a buffer layer and an oxide semiconductor layer on a substrate; forming a photoresist layer on the oxide semiconductor layer, patterning the photoresist layer, and removing the photoresist layer corresponding to a gate defining region to obtain a photoresist section; forming a first metal layer on the photoresist section and the oxide semiconductor layer which is not covered by the photoresist layer; and peeling off the photoresist section to remove the first metal layer on the photoresist section, wherein the first metal layer which corresponds to the gate defining region is remained to obtain a gate.

The method of manufacturing a display panel provided by the present disclosure includes the following steps: sequentially forming a buffer layer and an oxide semiconductor layer on a substrate; forming a photoresist layer on the oxide semiconductor layer, patterning the photoresist layer, and removing the photoresist layer corresponding to a gate defining region to obtain a photoresist section; forming a first metal layer on the photoresist layer and the oxide semiconductor layer which is not covered by the photoresist layer; and peeling off the photoresist section to remove the first metal layer on the photoresist section, wherein the first metal layer which corresponds to the gate defining region is remained to obtain a gate. Because the gate is formed by a stripping process, the top surface of the oxide semiconductor layer is prevented from being damaged, and conductivity of a device is improved.

DETAILED DESCRIPTION

Figure 1:
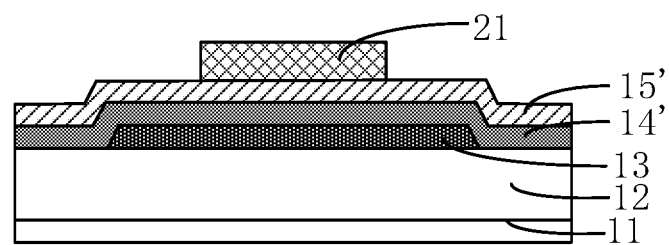
FIG. 1 is a schematic structural view showing a display panel manufactured by a conventional method.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

An insulating layer 14' of a conventional display panel contains Si that is prone to remain on the top surface of an oxide semiconductor layer 13, and impurities are prone to be dissolved in the Si, thereby reducing electron concentration in a channel.

A method of manufacturing a display panel provided by the present disclosure includes the following steps:

Step 101: forming a buffer layer on a substrate.

Figure 2:
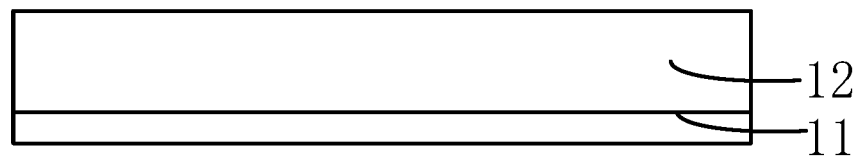
FIG. 2 is a schematic structural view showing a display panel manufactured by a method provided by the present disclosure after Step 1.

For example, as shown in FIG. 2, forming a buffer layer 12 on a substrate 11.

For example, forming the buffer layer 12 on the substrate 11 by chemical vapor deposition or atomic layer deposition. Material of the buffer layer 12 is $Si_2O_3$ or $Al_2O_3$, and thicknesses of the buffer layer 12 ranges from 100 nm to 1 μm.

Step 102: forming an oxide semiconductor layer on the buffer layer.

Figure 3:
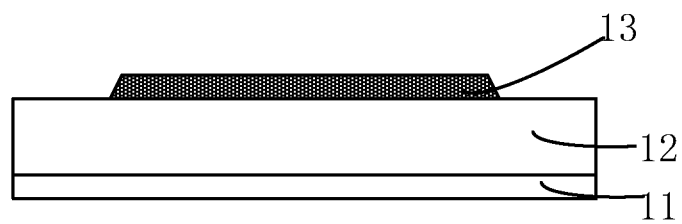
FIG. 3 is a schematic structural view showing the display panel manufactured by the method provided by the present disclosure after Step 2.

As shown in FIG. 3, depositing an oxide semiconductor layer 13 on the buffer layer 12 by magnetron sputtering, and then etching the oxide semiconductor layer 13 outside an active region to obtain a pattern as shown in FIG. 3. Material of the oxide semiconductor layer 13 is indium gallium zinc oxide (IGZO).

Step 103: forming a photoresist layer on the oxide semiconductor layer, patterning the photoresist layer, and removing the photoresist layer corresponding to a gate defining region to obtain a photoresist section.

Figure 4:
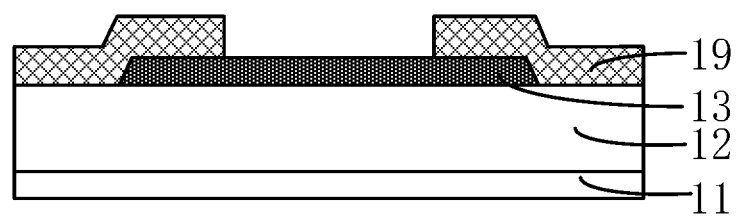
FIG. 4 is a schematic structural view showing the display panel manufactured by the method provided by the present disclosure after Step 3.

In one embodiment, as shown in FIG. 4, coating a negative photoresist onto the oxide semiconductor layer 13 and the buffer layer 12 which is not covered by the oxide semiconductor layer 13 to obtain a photoresist layer, and then exposing and developing the photoresist layer by a mask to remove the photoresist layer on a gate defining region which corresponds to a position of the gate, wherein the photoresist layer outside the gate defining region is remained to obtain a photoresist section 19.

Of course, it should be noted that material of the photoresist layer may also be a positive photoresist material.

To make a thickness of a first metal layer meet process requirements, a thickness of the photoresist layer is greater than or same as a thickness of a first metal layer 15, and the thickness of the photoresist layer is greater than or equal to 200 μm.

Step 104: forming the first metal layer on the photoresist section and the oxide semiconductor layer which is not covered by the photoresist section.

Figure 5:
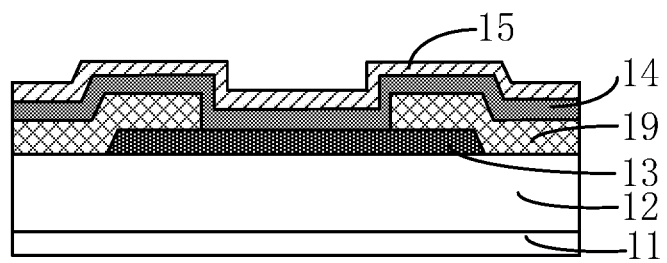
FIG. 5 is a schematic structural view showing the display panel manufactured by the method provided by the present disclosure after Step 4.

As shown in FIG. 5, forming the first metal layer 15 on a photoresist layer 19 and the oxide semiconductor layer 13 which is not covered by the photoresist section 19.

A sectional structure of the first metal layer 15 includes Mo/Al/Mo, Mo/Cu/Mo, or other material with low resistivity. Thicknesses of the first metal layer 15 range from 100 μm to 500 μm.

Step 105: peeling off the photoresist section to remove the first metal layer on the photoresist section, wherein the first metal layer which corresponds to the gate defining region is remained to obtain a gate.

Figure 6:
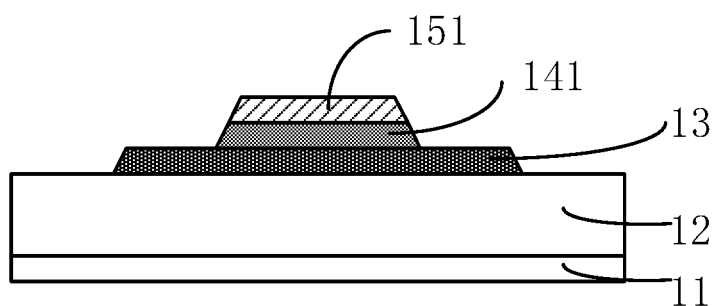
FIG. 6 is a schematic structural view showing the display panel manufactured by the method provided by the present disclosure after Step 5.

As shown in FIG. 6, peeling off the photoresist section 19 as well as the first metal layer 15 on the photoresist section 19, wherein the first metal layer 15 which corresponds to the gate defining region is remained to obtain a gate 151. That is, the first metal layer 15 which is not covered by the photoresist layer 19 and is disposed on the oxide semiconductor layer 13 is remained to obtain the gate 151.

The step of peeling off the photoresist layer includes:

Step 1051: peeling off the photoresist section 19 by a photoresist stripping process.

The above method may further include:

Step 106: forming a planarization layer on the gate and the oxide semiconductor layer which is not covered by the gate, and defining a first through hole and a second through hole in the planarization layer.

Figure 7:
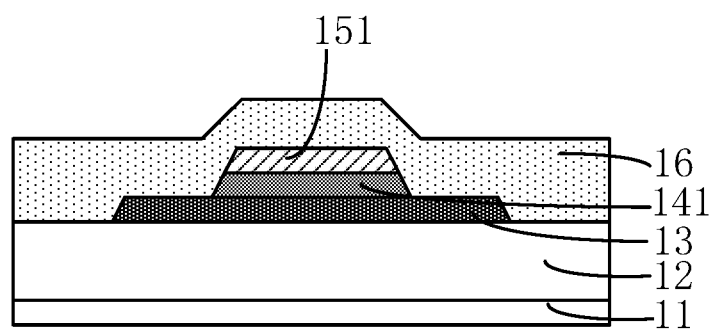
FIG. 7 is a schematic structural view showing the display panel manufactured by the method provided by the present disclosure after Step 6.

For example, as shown in FIG. 7, forming a planarization layer 16 by chemical vapor deposition or atomic layer deposition. Material of the planarization layer 16 includes at least one of $Si_2O_3$ or $Al_2O_3$, and thicknesses of the planarization layer 16 range from 100 nm to 1 μm.

Figure 8:
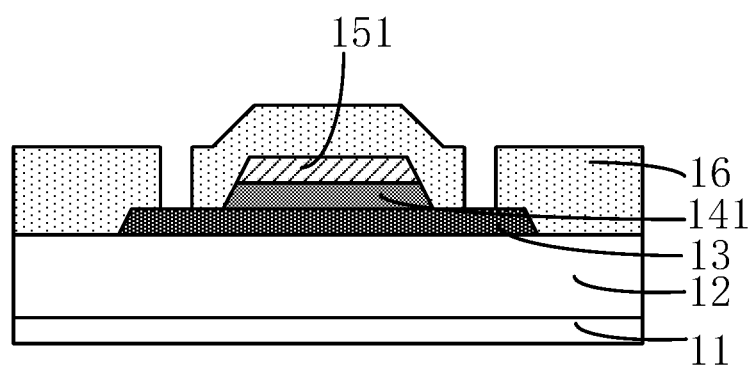
FIG. 8 is a schematic structural view showing the display panel manufactured by the method provided by the present disclosure after Step 7.

As shown in FIG. 8, defining two through holes in the planarization layer 16 by a lithography process and wet etching, namely, the first through hole and the second through hole.

Step 107: forming a source and a drain on the planarization layer, wherein the source is connected to the oxide semiconductor layer by the first through hole, and the drain is connected to the oxide semiconductor by the second through hole.

Figure 9:
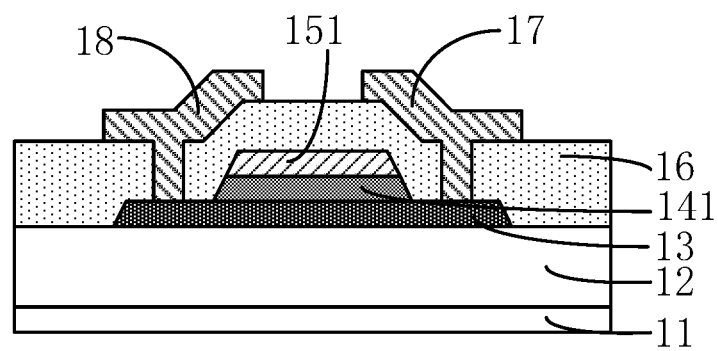
FIG. 9 is a schematic structural view showing the display panel manufactured by the method provided by the present disclosure after Step 8.

As shown in FIG. 9, depositing a second metal layer by physical vapor deposition, and etching metals outside a source 17 and a drain 18 to complete a thin film transistor (TFT). A sectional structure of the second metal layer includes Mo/Al/Mo, Mo/Cu/Mo, or other material with low resistivity. Thicknesses of the second metal layer may range from 100 μm to 500 μm. The source 17 is connected to the oxide semiconductor layer 13 by the first through hole, and the drain 18 is connected to the oxide semiconductor layer 13 by the second through hole.

The display panel manufactured by the method of the present disclosure may be a liquid crystal display (LCD) panel or an organic light-emitting diode (OLED) display panel. The above method may include forming an anode, an organic luminescent layer, and a cathode on the second metal layer if the display panel is the OLED display panel.

In another embodiment, the Step 104 (the step of forming the first metal layer on the photoresist section and the oxide semiconductor layer which is not covered by the photoresist section) includes:

Step 201: sequentially forming a first insulating layer and the first metal layer on the photoresist layer and the oxide semiconductor layer which is not covered by the photoresist layer.

As shown in FIG. 5, a first insulating layer 14 and the first metal layer 15 are sequentially formed on the photoresist layer 19 and the oxide semiconductor layer 13 which is not covered by the photoresist layer 19, which prevents Si from being remained on the top surface of the oxide semiconductor layer 13. Therefore, impurities dissolved in the Si is reduced, thereby preventing an electron concentration in a channel from being reduced. As a result, conductivity is further improved. Material of the first insulating layer 14 is $Si_2O_3$ or $Al_2O_3$, and thicknesses of the first insulating layer 14 range from 100 μm to 500 μm.

The first insulating layer 14 may be deposited by chemical vapor deposition. In one embodiment, the first metal layer 15 is deposited by physical vapor deposition.

The Step 105 (the step of peeling off the photoresist section to remove the first metal layer on the photoresist section, wherein the first metal layer which corresponds to the gate defining region is remained to obtain a gate) includes:

Step 202: peeling off the photoresist section to remove the first insulating layer and the first metal layer on the photoresist section, wherein the first insulating layer and the first metal layer which correspond to the gate defining region are remained to respectively obtain a gate insulating layer and a gate.

For example, as shown in FIG. 6, the photoresist section 19 is peeled off to remove the first insulating layer 14 and the first metal layer 15 on the photoresist section 19, wherein the first insulating layer 14 and the first metal layer 15 which correspond to the gate defining region are remained to respectively obtain a gate insulating layer 141 and a gate 151. That is, the first insulating layer 14 and the first metal layer 15 which are not covered by the photoresist section 19 and are disposed on the oxide semiconductor layer 13 are remained to obtain the gate insulating layer 141 and the gate 151.

For example, the first insulating layer 14 and the first metal layer 15 which are outside the gate defining region are peeled off by the photoresist stripping process to obtain the gate insulating layer 141 and the gate 151.

Compared to manufacturing a gate by the etching process, manufacturing the gate by the stripping process can prevent damage to the top surface of the oxide semiconductor layer, can reduce defects, and can improve conductivity of a device. Furthermore, in the present disclosure, the gate insulating layer is also manufactured by the stripping process, which reduces introduction of impurities, prevents an electron concentration in a channel from being reduced, and further improves conductivity.

The method of manufacturing a display panel provided by the present disclosure includes the following steps: sequentially forming a buffer layer and an oxide semiconductor layer on a substrate; forming a photoresist layer on the oxide semiconductor layer, patterning the photoresist layer, and removing the photoresist layer corresponding to a gate defining region to obtain a photoresist section; forming a first metal layer on the photoresist layer and the oxide semiconductor layer which is not covered by the photoresist layer; and peeling off the photoresist section to remove the first metal layer on the photoresist section, wherein the first metal layer which corresponds to the gate defining region is remained to obtain a gate. Because the gate is formed by the stripping process, damage to a surface of the oxide semiconductor layer is prevented, and conductivity of a device is improved.

In summary, the present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:
1. A method of manufacturing a display panel, comprising:
sequentially forming a buffer layer and an oxide semiconductor layer on a substrate;
forming a photoresist layer on the oxide semiconductor layer, patterning the photoresist layer, and removing the photoresist layer corresponding to a gate defining region to obtain a photoresist section, wherein material of the photoresist layer is a negative photoresist material;
sequentially forming a first insulating layer and a first metal layer on the photoresist layer and the oxide semiconductor layer which is not covered by the photoresist layer; and
peeling off the photoresist section to remove the first insulating layer and the first metal layer on the photoresist section, wherein the first insulating layer and the first metal layer which correspond to the gate defining region are remained to respectively obtain a gate insulating layer and a gate.
2. The method of claim 1, wherein the step of peeling off the photoresist section comprises:
peeling off the photoresist section by a photoresist stripping process.

3. The method of claim 1, wherein a thickness of the photoresist layer is greater than or same as a thickness of the first metal layer.
4. The method of claim 3, wherein the thickness of the photoresist layer is greater than or equal to 200 μm.
5. The method of claim 1, wherein a sectional structure of the first metal layer comprises Mo/Al/Mo or Mo/Cu/Mo.
6. The method of claim 1, wherein the method further comprises:
forming a planarization layer on the gate and the oxide semiconductor layer which is not covered by the gate, and defining a first through hole and a second through hole in the planarization layer; and
forming a source and a drain on the planarization layer, wherein the source is connected to the oxide semiconductor layer by the first through hole, and the drain is connected to the oxide semiconductor by the second through hole.
7. The method of claim 6, wherein material of the planarization layer comprises at least one of $SiO_2$ or $Al_2O_3$.
8. The method of claim 1, wherein material of the oxide semiconductor layer is indium gallium zinc oxide (IGZO).
9. A method of manufacturing a display panel, comprising:
sequentially forming a buffer layer and an oxide semiconductor layer on a substrate;
forming a photoresist layer on the oxide semiconductor layer, patterning the photoresist layer, and removing the photoresist layer corresponding to a gate defining region to obtain a photoresist section;
forming a first metal layer on the photoresist section and the oxide semiconductor layer which is not covered by the photoresist layer; and
peeling off the photoresist section to remove the first metal layer on the photoresist section, wherein the first metal layer which corresponds to the gate defining region is remained to obtain a gate.
10. The method of claim 9, wherein the step of forming the first metal layer on the photoresist section and the oxide semiconductor layer which is not covered by the photoresist section comprises:
sequentially forming a first insulating layer and the first metal layer on the photoresist layer and the oxide semiconductor layer which is not covered by the photoresist layer; and
wherein the step of peeling off the photoresist section to remove the first metal layer on the photoresist section, wherein the first metal layer which corresponds to the gate defining region is remained to obtain the gate comprises:
peeling off the photoresist section to remove the first insulating layer and the first metal layer on the photoresist section, wherein the first insulating layer and the first metal layer which correspond to the gate defining region are remained to respectively obtain a gate insulating layer and the gate.
11. The method of claim 9, wherein the step of peeling off the photoresist section comprises:
peeling off the photoresist section by a photoresist stripping process.
12. The method of claim 9, wherein a thickness of the photoresist layer is greater than or same as a thickness of the first metal layer.
13. The method of claim 12, wherein the thickness of the photoresist layer is greater than or equal to 200 μm.
14. The method of claim 9, wherein material of the photoresist layer is a negative photoresist material.

15. The method of claim 9, wherein a sectional structure of the first metal layer comprises Mo/Al/Mo or Mo/Cu/Mo.

16. The method of claim 9, wherein the method further comprises:
- forming a planarization layer on the gate and the oxide semiconductor layer which is not covered by the gate, and defining a first through hole and a second through hole in the planarization layer; and
- forming a source and a drain on the planarization layer, wherein the source is connected to the oxide semiconductor layer by the first through hole, and the drain is connected to the oxide semiconductor by the second through hole.

17. The method of claim 16, wherein material of the planarization layer comprises at least one of $SiO_2$ or $Al_2O_3$.

18. The method of claim 9, wherein material of the oxide semiconductor layer is indium gallium zinc oxide (IGZO).

\* \* \* \* \*